United States Patent
Lee et al.

(10) Patent No.: US 9,722,049 B2
(45) Date of Patent: Aug. 1, 2017

(54) METHODS FOR FORMING CRYSTALLINE IGZO WITH A SEED LAYER

(71) Applicants: Intermolecular Inc., San Jose, CA (US); LG Display Co., Ltd.

(72) Inventors: Sang Lee, San Jose, CA (US); Khaled Ahmed, Anaheim, CA (US); Youn-Gyoung Chang, Gyeonggi-do (KR); Min-Cheol Kim, Gyeonggi-do (KR); Minh Huu Le, San Jose, CA (US); Kwon-Sik Park, Gangnam-gu (KR); Woosup Shin, Gyeonggi-do (KR)

(73) Assignees: Intermolecular, Inc., San Jose, CA (US); LG Display Co., Ltd., Seoul (KR)

( * ) Notice: Subject to any disclaimer, the term of this patent is extended or adjusted under 35 U.S.C. 154(b) by 0 days.

(21) Appl. No.: 14/138,750

(22) Filed: Dec. 23, 2013

(65) Prior Publication Data

US 2015/0179442 A1  Jun. 25, 2015

(51) Int. Cl.
*H01L 21/00* (2006.01)
*H01L 29/66* (2006.01)

(52) U.S. Cl.
CPC .............................. *H01L 29/66742* (2013.01)

(58) Field of Classification Search
CPC ............. H01L 29/7869; H01L 21/0242; H01L 21/02472; H01L 21/02356; H01L 21/02645; H01L 29/66742; H01L 21/02; H01L 29/66; H01L 29/66969; H01L 27/1225
USPC ............... 257/43, 40, 57, E29.068, E29.273, 257/E21.411, E29.296; 438/104, 150, 438/158, 478
See application file for complete search history.

(56) References Cited

U.S. PATENT DOCUMENTS

| | | | |
|---|---|---|---|
| 8,367,489 B2 | 2/2013 | Yamazaki | |
| 2010/0035379 A1* | 2/2010 | Miyairi | H01L 29/78606 438/104 |
| 2010/0090218 A1* | 4/2010 | Tsukahara | 257/43 |
| 2011/0127521 A1* | 6/2011 | Yamazaki | 257/43 |
| 2011/0217815 A1 | 9/2011 | Honda | |
| 2012/0132903 A1* | 5/2012 | Yamazaki et al. | 257/43 |
| 2012/0138922 A1* | 6/2012 | Yamazaki et al. | 257/43 |
| 2013/0082256 A1 | 4/2013 | Yamazaki | |
| 2013/0256666 A1* | 10/2013 | Chang | H01L 29/78693 257/57 |
| 2013/0280859 A1* | 10/2013 | Kim | H01L 29/7869 438/104 |
| 2014/0175423 A1* | 6/2014 | Jeong et al. | 257/43 |

* cited by examiner

*Primary Examiner* — Yosef Gebreyesus

(57) ABSTRACT

Embodiments described herein provide method for forming crystalline indium-gallium-zinc oxide (IGZO). A substrate is provided. A seed layer is formed above the substrate. The seed layer has a crystalline structure that is substantially dominant along the c-axis. An IGZO layer is formed above the seed layer. The seed layer may include zinc oxide. A stack of alternating seed layers and IGZO layers may be formed.

20 Claims, 12 Drawing Sheets

METHODS FOR FORMING CRYSTALLINE IGZO WITH A SEED LAYER

TECHNICAL FIELD

The present invention relates to indium-gallium-zinc oxide (IGZO). More particularly, this invention relates to methods for forming crystalline IGZO using a seed layer, as well as methods for forming IGZO devices, such as IGZO thin film transistors (TFTs), incorporating crystalline IGZO.

BACKGROUND OF THE INVENTION

Indium-gallium-zinc oxide (IGZO) devices, such as IGZO thin-film transistors (TFTs) have attracted a considerable amount of attention due to the associated low cost, room temperature manufacturing processes with good uniformity control, high mobility for high speed operation, and the compatibility with transparent, flexible, and light display applications. Due to these attributes, IGZO TFTs may even be favored over low cost amorphous silicon TFTs and relatively high mobility polycrystalline silicon TFT for display device applications. IGZO devices typically utilize amorphous IGZO (a-IGZO).

Recent developments in the field suggest that the use of crystalline IGZO may provide improved electrical and chemical stability. However, little work has been done to determine how to form crystalline IGZO, or convert a-IGZO to crystalline IGZO, using already-existing manufacturing and processing equipment.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Embodiments described herein provide methods for improving the electrical and chemical stability of indium-gallium-zinc oxide (IGZO). In particular, embodiments described herein methods for enhancing the crystalline structure of the IGZO along the c-axis (i.e., along the (009) plane, or in the direction perpendicular to the substrate), which improves the electrical and chemical stability of the IGZO.

In some embodiments, this is accomplished by forming the IGZO above (e.g., on/adjacent to) a seed layer that is made of a material that has a crystalline structure that is (more) dominant along the c-axis (when compared to amorphous IGZO). In some embodiments, the seed layer is made of zinc oxide. Because the IGZO is formed above/on/adjacent to the seed layer, the crystalline structure of the IGZO (especially near the substrate) is enhanced along the c-axis. Additionally, because the IGZO is grown with a more dominant c-axis crystalline structure, the need to perform a high temperature annealing process (e.g., to enhance the crystalline structure) is reduced.

In some embodiments, the IGZO is formed as a channel (or channel layer) in an IGZO device, such as an IGZO thin-film transistor (TFT). In some embodiments, the IGZO channel is formed with a series of sub-layers which alternate between zinc oxide and IGZO.

Figure 1:
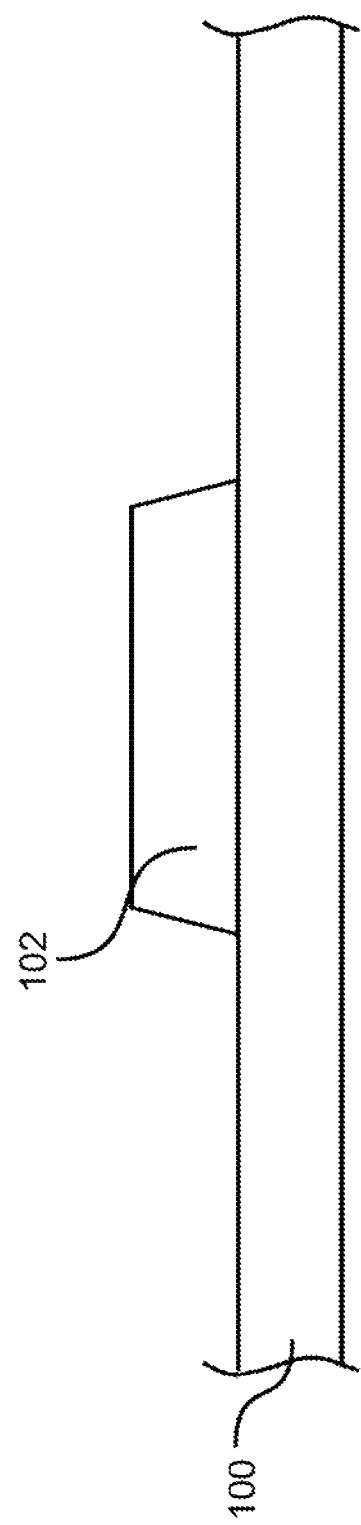
FIG. 1 is a cross-sectional view of a substrate with gate electrode formed above.

FIGS. 1-8 illustrate a method for forming an IGZO device (e.g., an IGZO TFT), according to some embodiments. Referring now to FIG. 1, a substrate 100 is shown. In some embodiments, the substrate 100 is transparent and is made of, for example, glass. The substrate 100 may have a thickness of, for example, between 0.1 and 2.0 centimeters (cm). Although only a portion of the substrate 100 is shown, it should be understood that the substrate 100 may have a width of, for example, between 5.0 cm and 4.0 meters (m).

Still referring to FIG. 1, a gate electrode 102 is formed above the transparent substrate 100. In some embodiments, the gate electrode 102 is made of a conductive material, such as copper, silver, aluminum, manganese, or a combination thereof. The gate electrode 102 may have a thickness of, for example, between about 30 nanometers (nm) and about 300 nm. Although not shown, it should be understood that in some embodiments, a seed layer is formed between the substrate 100 and the gate electrode 102. In some embodiments, the seed layer includes copper and has a thickness of, for example, between about 1 nm and about 5 nm. The seed layer may be made of copper-manganese alloy (e.g., 96-99% copper and 1-4% manganese).

It should be understood that the various components on the substrate, such as the gate electrode 102 and those described below, are formed using processing techniques suitable for the particular materials being deposited, such as physical vapor deposition (PVD) (e.g., co-sputtering in some embodiments), chemical vapor deposition (CVD), electroplating, etc. Furthermore, although not specifically shown in the figures, it should be understood that the various components on the substrate 100, such as the gate electrode 102, may be sized and shaped using a photolithography process and an etching process, as is commonly understood, such that the components are formed above selected regions of the substrate 100.

Figure 2:
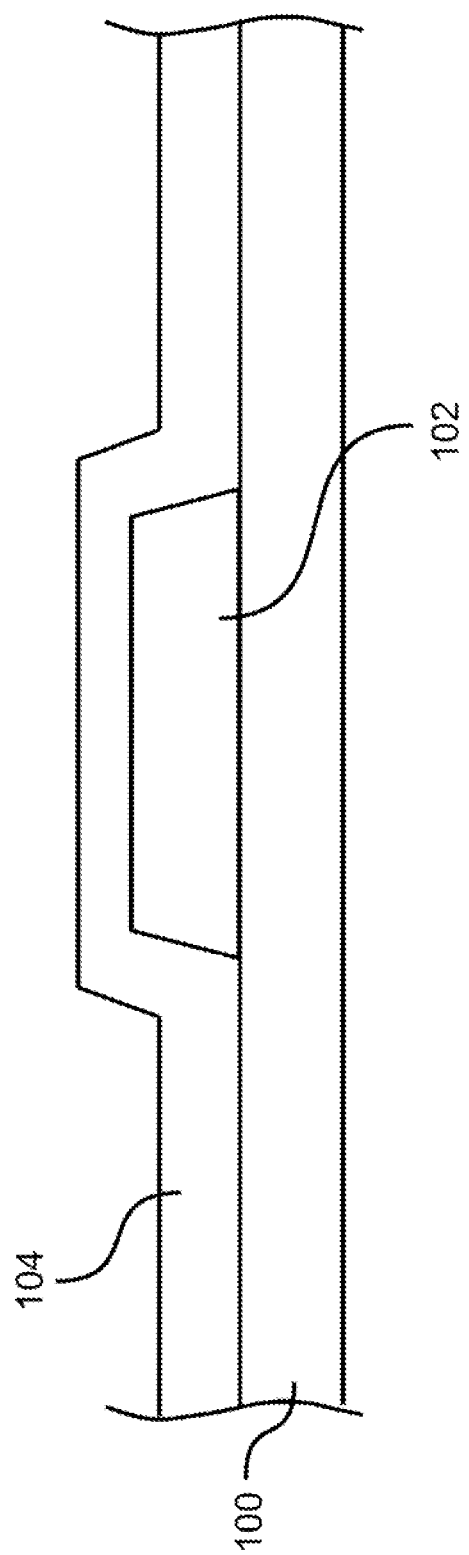
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, silicon nitride, silicon oxide, or a high-k dielectric (e.g., having a dielectric constant greater than 3.9), such as zirconium oxide, hafnium oxide, or aluminum oxide. In some embodiments, the gate dielectric layer 104 has a thickness of, for example, between about 30 nm and about 100 nm.

Figure 3:
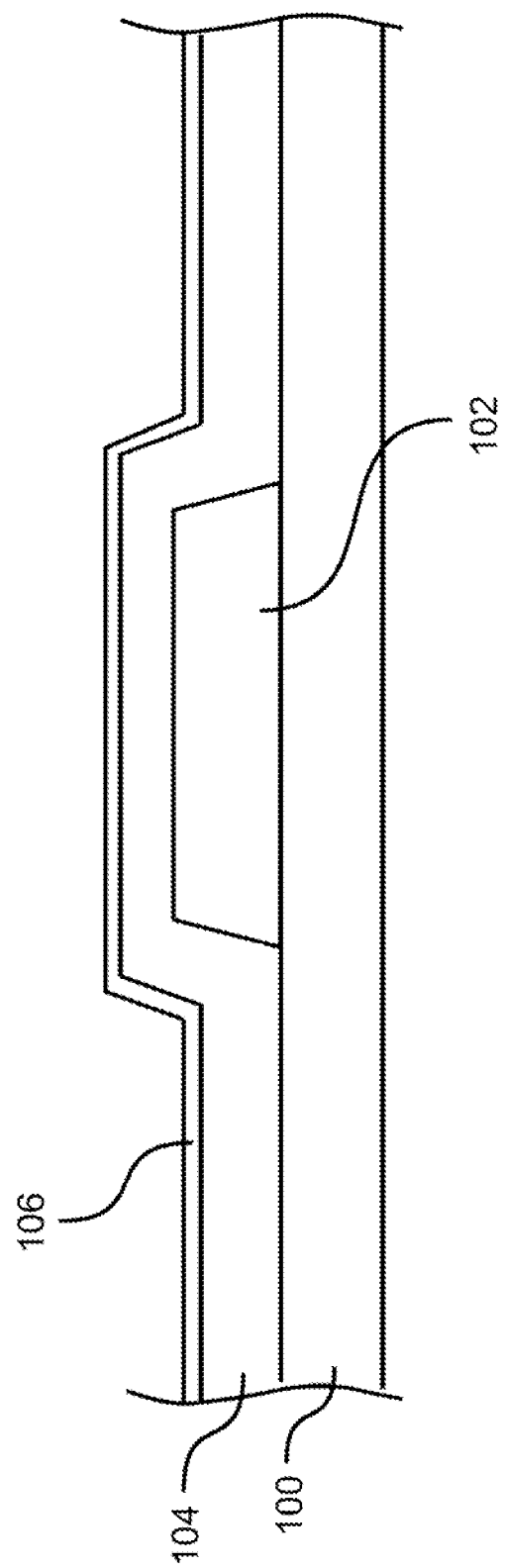
FIG. 3 is a cross-sectional view of the substrate of FIG. 2 with a seed layer formed above the gate dielectric layer.

Next, as shown in FIG. 3, a seed layer 106 is formed above the gate dielectric layer 104. In some embodiments, the seed layer 106 includes (e.g., is made of) a material that has a crystalline structure that is substantially dominant along the c-axis (or along the (009) plane). The seed layer 106 may include zinc. In some embodiments, the seed layer 106 is made of zinc oxide. The seed layer 106 may have a thickness of, for example, between about 2 nanometers (nm) and about 10 nm, such as about 5 nm. The seed layer 106 may be formed using a deposition process, such as PVD, at processing temperatures below 500° C., such as between about 50° C. and about 300° C.

In some embodiments, the seed layer 106 is doped (e.g., via ion implantation) with indium, gallium, or a combination thereof. In such embodiments, the seed layer 106 may be understood to include one or more sub-layers (e.g., a zinc oxide sub-layer and a indium-doped zinc oxide sub-layer above the zinc oxide sub-layer).

Figure 4:
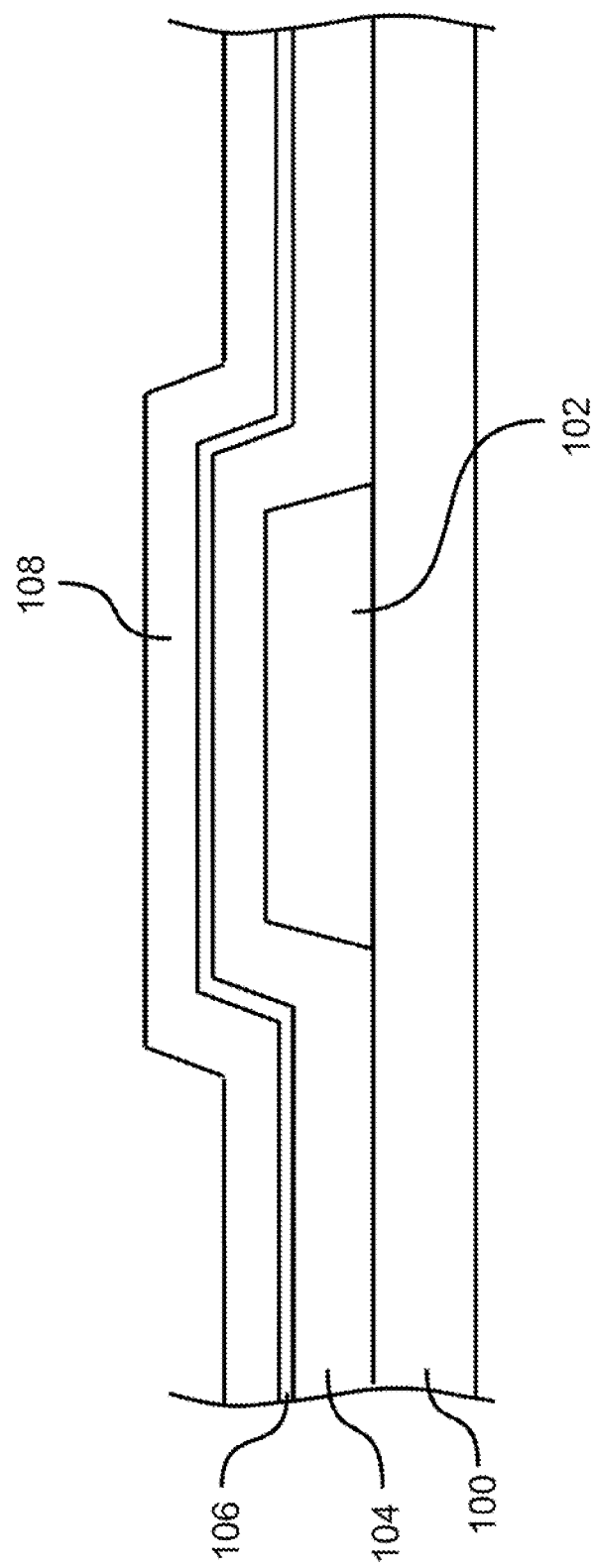
FIG. 4 is a cross-sectional view of the substrate of FIG. 3 with an indium-gallium-zinc oxide (IGZO) layer formed above the seed layer.

As shown in FIG. 4, an IGZO layer 108 is then formed above (e.g., adjacent to/on) the seed layer 106. The IGZO used to form the IGZO layer 108 may initially be made of amorphous indium-gallium-zinc oxide (a-IGZO) in which a ratio of the respective elements is, for example, 1:1:1:4. The IGZO layer 108 may have a thickness of, for example, between about 20 nm and about 50 nm.

As the IGZO is formed (or grown) above (e.g., on/adjacent to) the seed layer 106, the IGZO grows with a crystalline structure similar to that of the seed layer (e.g., dominate along the c-axis). That is, the seed layer 106 enhances the crystalline structure of the IGZO layer 108, especially the portions of the IGZO layer 108 near the seed layer 106. The enhancement of the crystalline structure of the IGZO layer 108 may result from the IGZO having an a-axis lattice constant similar to zinc oxide (i.e., a=3.295 Angstroms (Å) for IGZO and a=3.25 Å for zinc oxide).

Figure 5:
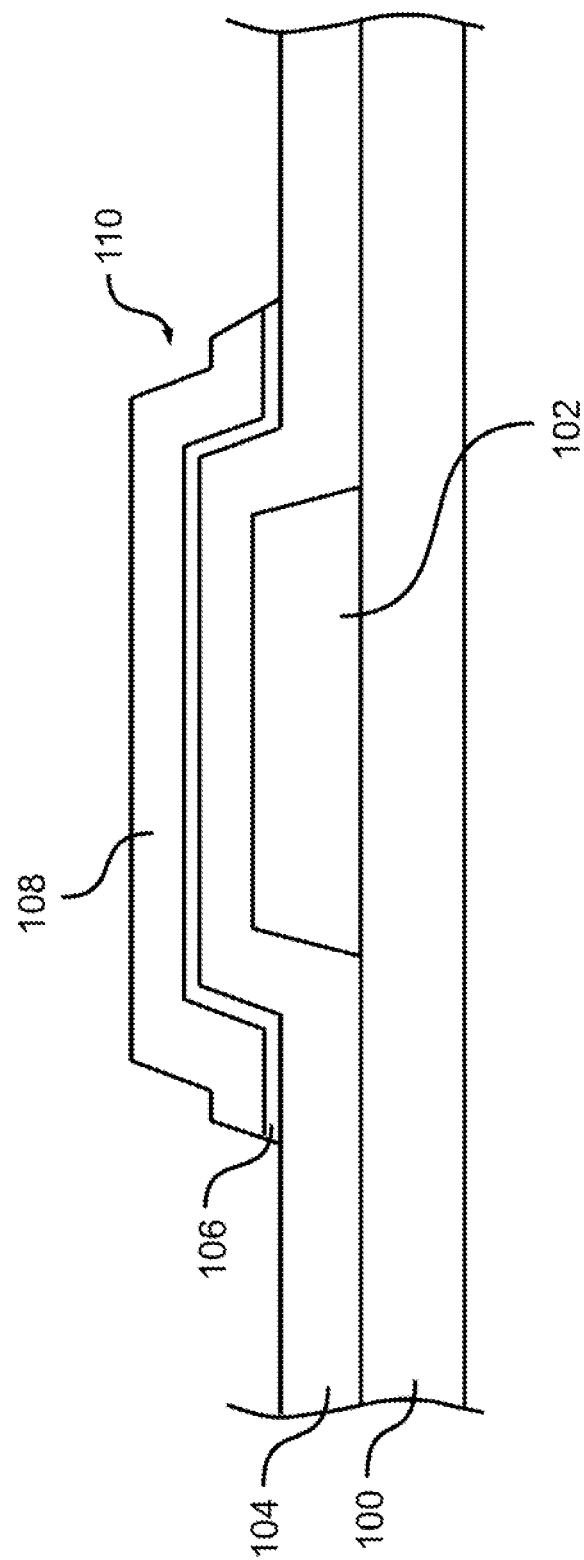
FIG. 5 is a cross-sectional view of the substrate of FIG. 4 after the seed layer and the IGZO have been etched to define a IGZO channel.

Referring to FIG. 5, the seed layer 106 and the IGZO layer 108 are then selectively etched to form (or define) an IGZO channel (or IGZO channel layer) 110. As shown, the IGZO channel 110 is formed above the gate dielectric layer 104, over the gate electrode 102. Although not specifically shown, is some embodiments, the IGZO channel 110 (and the other components shown in FIG. 5) may undergo an annealing process. In some embodiments, the annealing process includes a relatively low temperature (e.g., less than about 500° C., preferably less than 450° C.) heating process in, for example, an ambient gaseous environment (e.g., nitrogen ambient or air) to further enhance the crystalline structure of the IGZO. The heating process may occur for between about 60 minutes and about 120 minutes.

Figure 6:
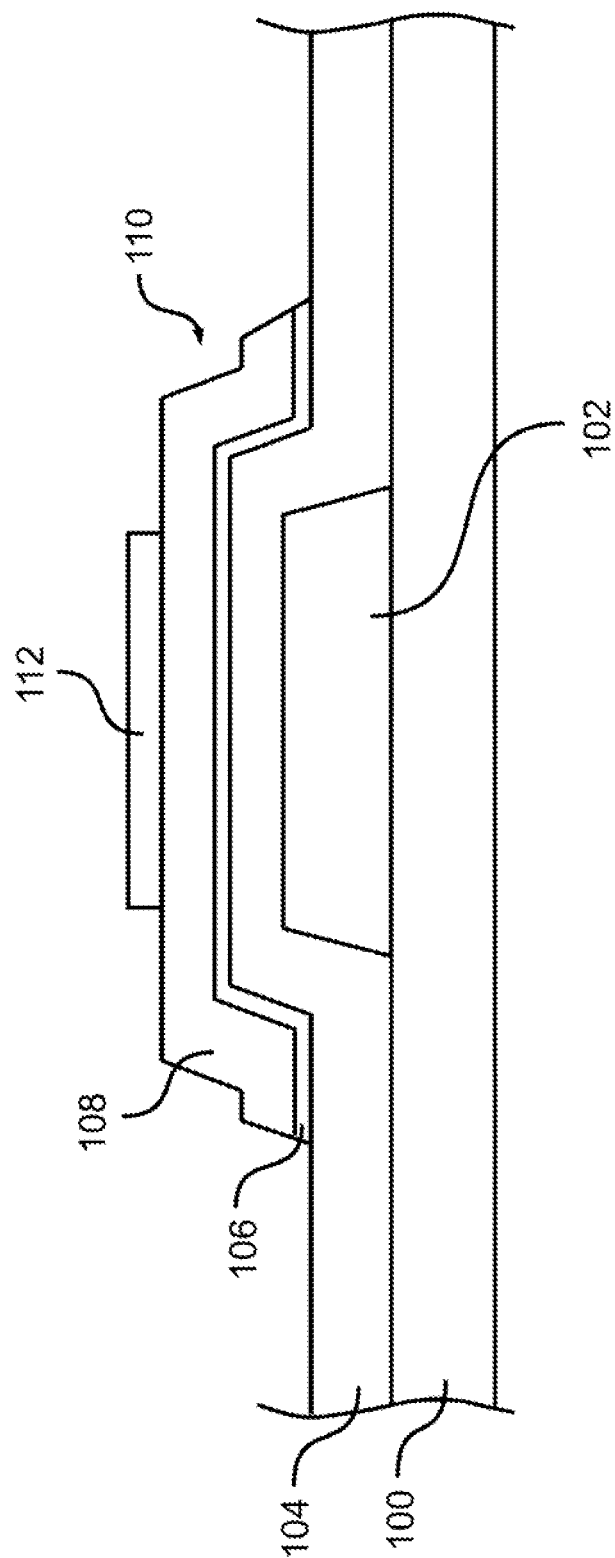
FIG. 6 is a cross-sectional view of the substrate of FIG. 5 with an etch-stop layer formed above the IGZO channel.

Referring now to FIG. 6, an etch-stop layer 112 is then formed above the IGZO channel 110. In some embodiments, the etch-stop layer is made of, silicon nitride, silicon oxide, or a high-k dielectric, such as aluminum oxide and/or hafnium oxide. The etch-stop layer 112 may have a thickness of, for example, between about 20 nm and about 100 nm. It should be understood that in some embodiments, a conventional etch-stop layer is not formed above the IGZO channel 110, but rather the source and drain regions (described below) are selectively etched using a "back-channel etch" (BCE) process, as is commonly understood.

Figure 7:
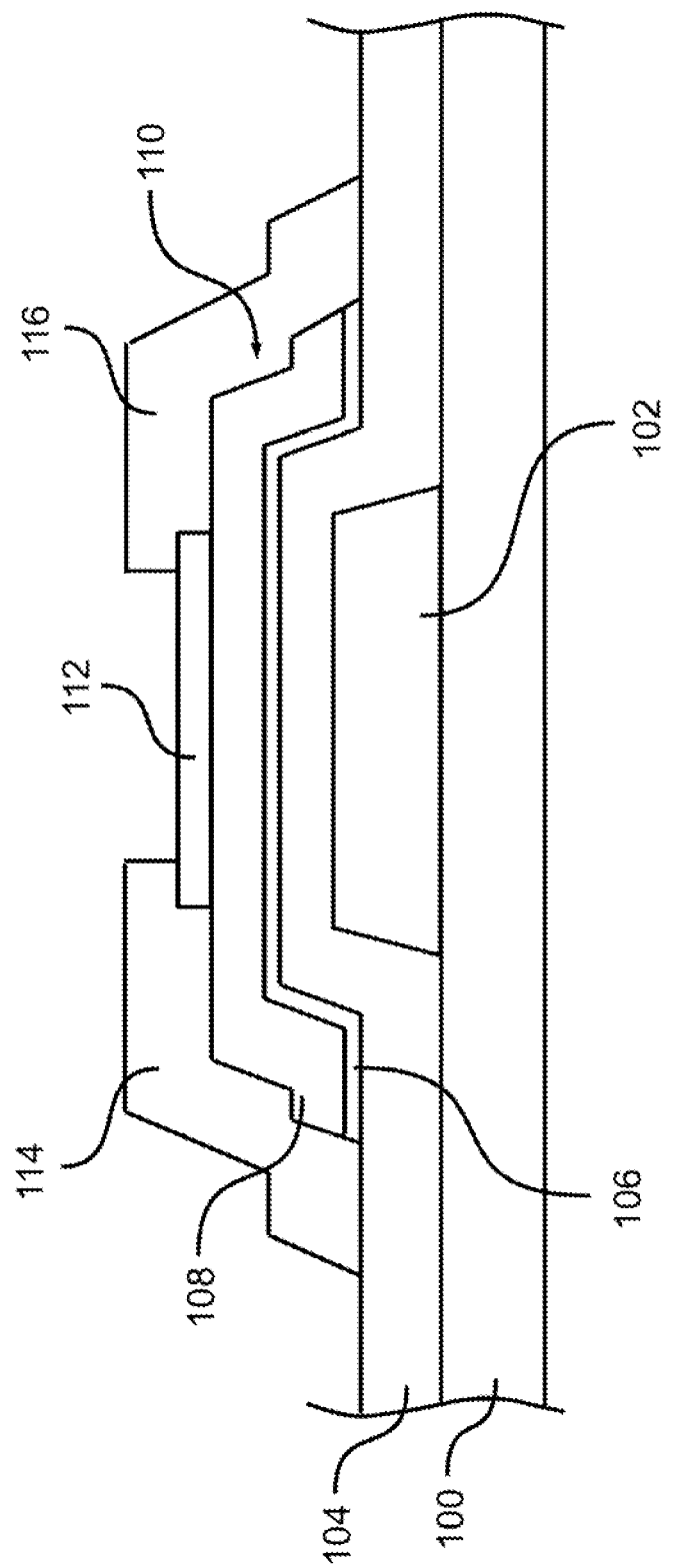
FIG. 7 is a cross-sectional view of the substrate of FIG. 6 with source and drain regions formed above the IGZO channel and the etch-stop layer.

Next, as shown in FIG. 7, a source region (or electrode) 114 and a drain region 116 are formed above the IGZO channel 110. As shown, the source region 114 and the drain region 114 lie on opposing sides of, and partially overlap the ends of, the etch-stop layer 112 (which may be used to protect the IGZO channel 110 during an etch process used to define the source region 114 and the drain region 116). In some embodiments, the source region 114 and the drain region 116 are made of titanium, molybdenum, copper, copper-manganese alloy, or a combination thereof. The source region 114 and the drain regions 116 may have a thickness of, for example, between about 50 nm and 0.5 micrometers (μm).

Figure 8:
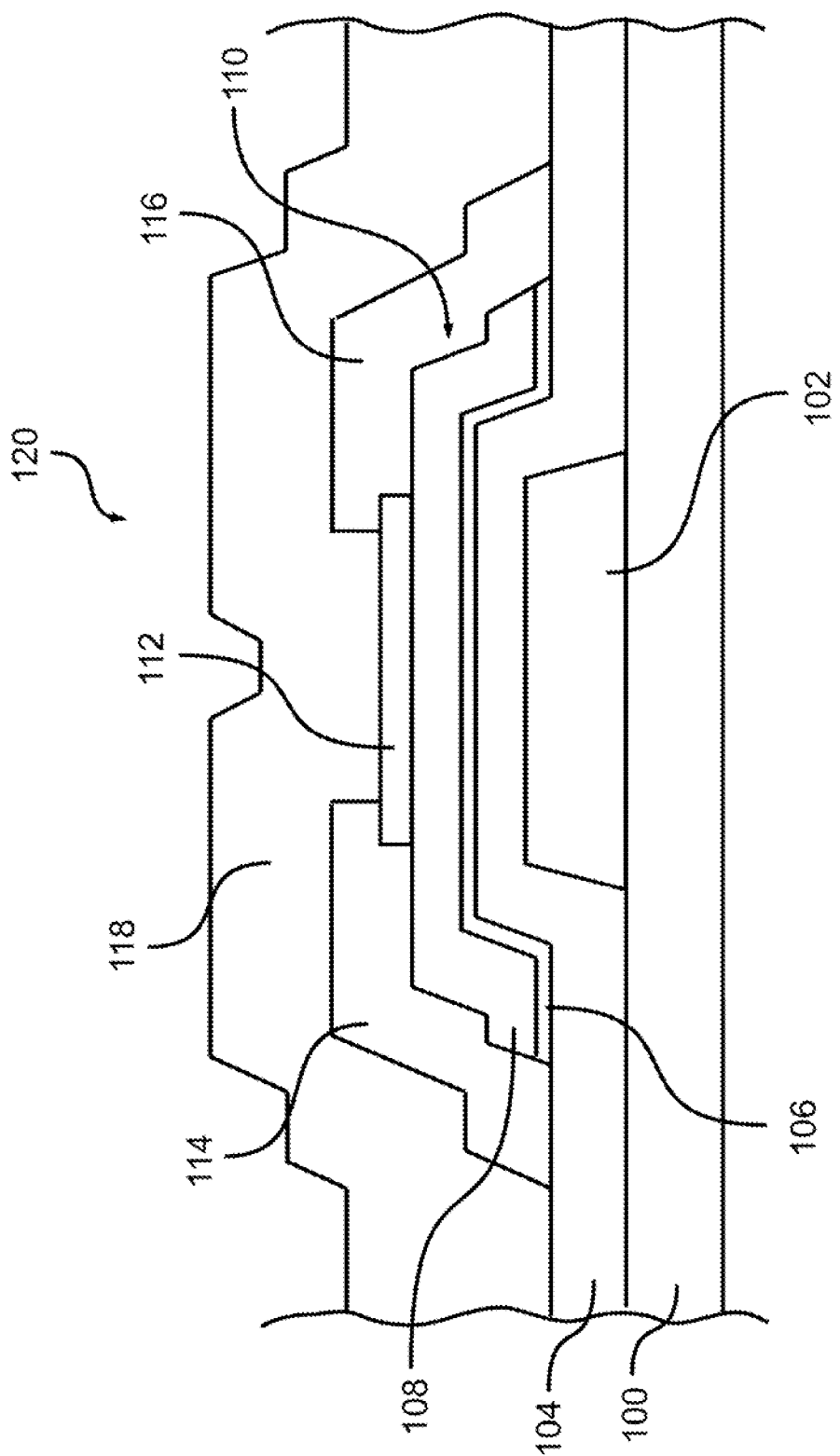
FIG. 8 is a cross-sectional view of the substrate of FIG. 7 with a passivation layer formed above the source and drain regions.

Referring to FIG. 8, a passivation layer 118 is then formed above the source region 114, the drain region 116, the etch-stop layer 112, and the gate dielectric layer 104. In some embodiments, the passivation layer 118 is made of silicon oxide, silicon nitride, or a combination thereof and has a thickness of, for example, between about 0.1 μm and about 1.5 μm.

The deposition of the passivation layer 118 may substantially complete the formation of an IGZO device 120, such as an inverted, staggered bottom-gate IGZO TFT. It should be understood that although only a single device 120 is shown as being formed on a particular portion of the substrate 100 in FIGS. 1-8, the manufacturing processes described above may be simultaneously performed on multiple portions of the substrate 100 such that multiple devices 120 are simultaneously formed, as is commonly understood.

The enhanced crystalline structure of the IGZO may improve both the electrical and chemical stability of the IGZO, as well as increase the channel mobility. When utilized in an IGZO device, such as the IGZO TFT described above, the crystalline IGZO may improve device performance, especially with respect to reliability and longevity. The use of the seed layer may also reduce the temperature required for the annealing process (or even completely eliminate the need for the annealing process), thus reducing overall processing temperatures. Additionally, it should be noted that the methods described herein may be easily incorporated into already-existing IGZO device manufacturing processes and equipment.

Figure 9:
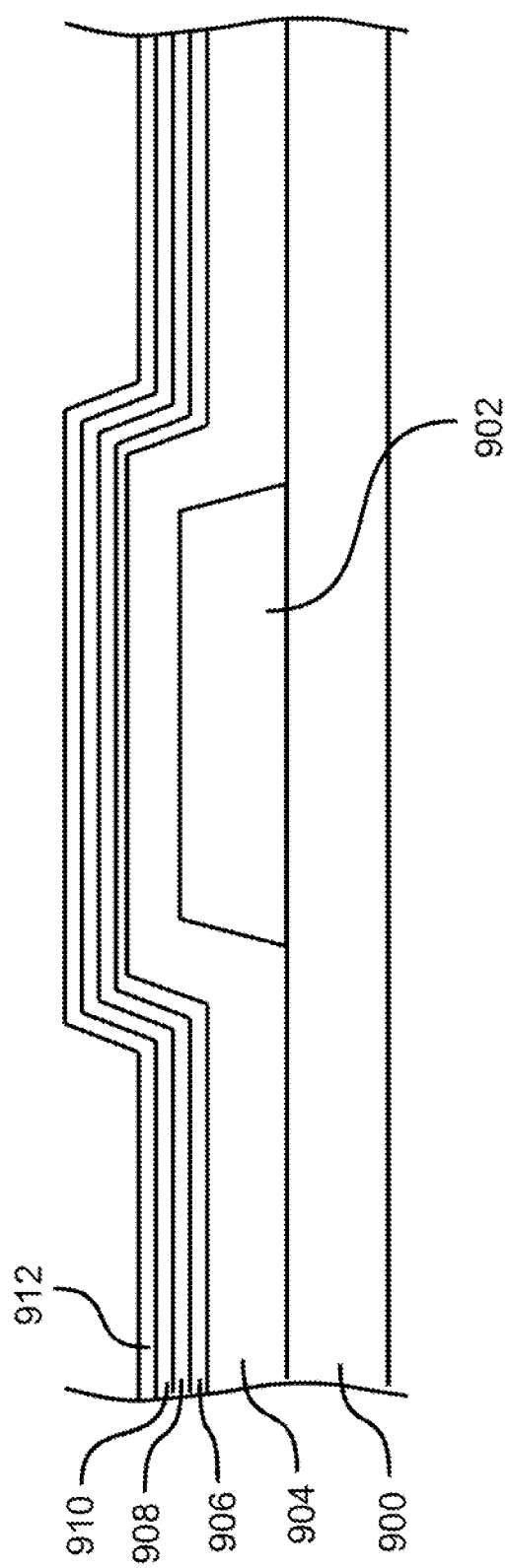
FIG. 9 is a cross-section view of a substrate with a gate electrode, gate dielectric layer, and a series of sub-layers formed above.
Figure 10:
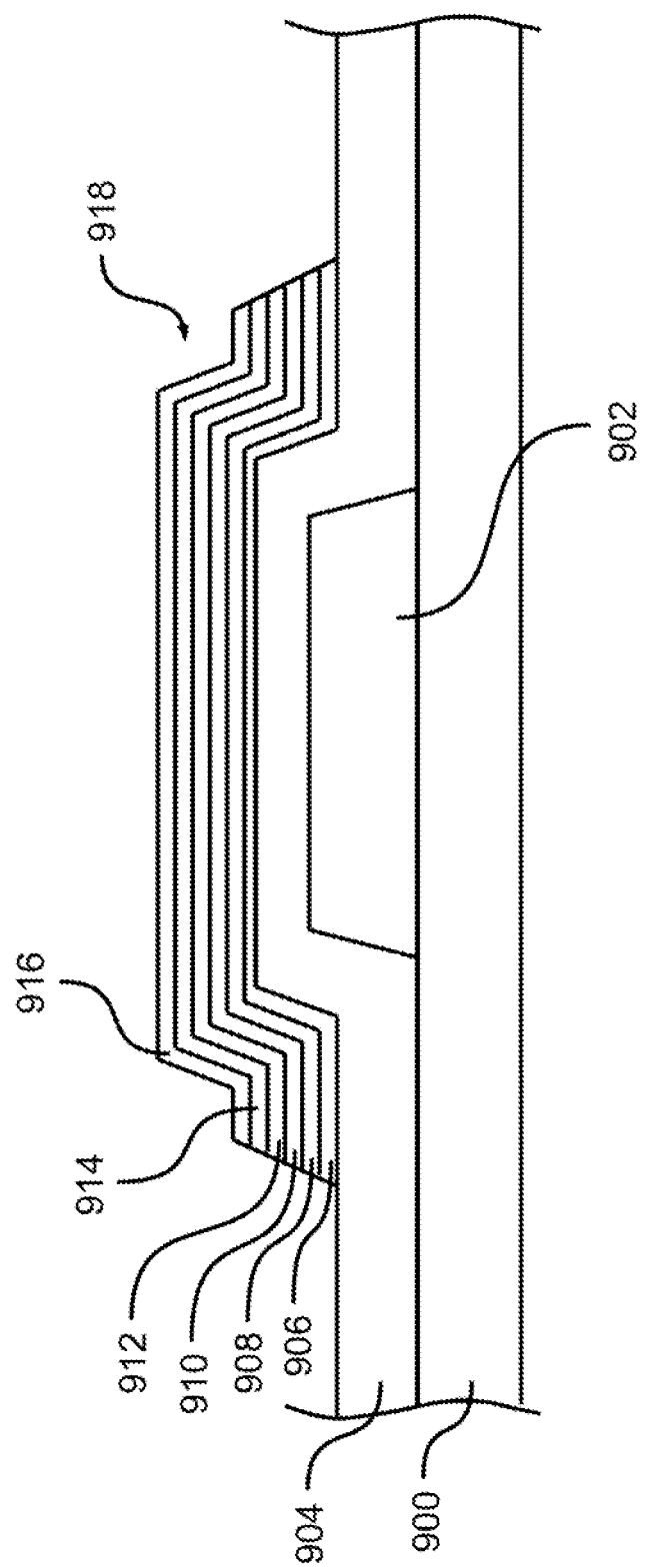
FIG. 10 is a cross-section view of a substrate of FIG. 9 after the seed layer and the sub-layers have been etched to define a IGZO channel.
Figure 11:
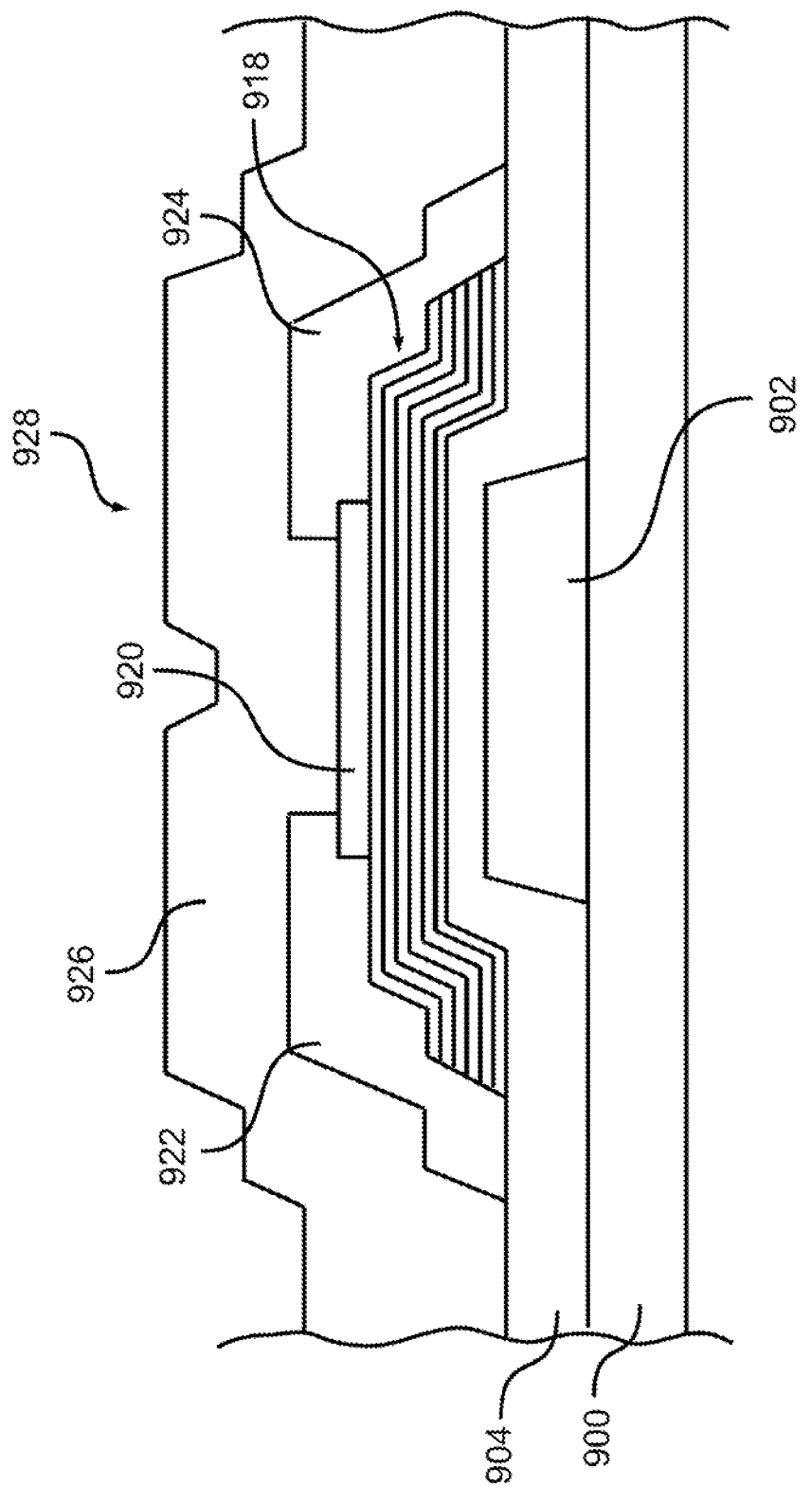
FIG. 11 is a cross-section view of the substrate of FIG. 10 with an etch-stop layer, source and drain regions, and a passivation layer formed above the IGZO channel.

FIGS. 9-11 illustrate a method for forming a method for forming an IGZO device (e.g., an IGZO TFT), according to some embodiments. As shown in FIG. 9, a substrate 900, a gate electrode 902, and gate dielectric layer 904, similar to those described above, are provided/formed.

Still referring to FIG. 9, a channel layer is formed by a series (or stack) of "nano-laminates" (or relatively thin layers, or sub-layers) 906-912 above the gate dielectric layer 904. In some embodiments, the sub-layers 906-912 alternate between a material that has a crystalline structure that is substantially dominant along the c-axis (e.g., zinc oxide) and IGZO. In particular, in some embodiments, sub-layer 906, which may be considered a seed layer, is formed above (e.g., adjacent to/on) the gate dielectric layer 904 and includes (e.g., is made of) zinc oxide. Sub-layer 908 is formed above sub-layer 906 and includes IGZO. Sub-layer 910 is formed above sub-layer 908 and includes, for example, zinc oxide. Sub-layer 912 is formed above sub-layer 910 and includes IGZO. Each of the sub-layers 906-912 may have a thickness of, for example, between about 2 nm and 10 nm, such as 5 nm.

Although four sub-layers 906-912 are shown in FIG. 9, it should be understood that the number of sub-layers 906-912 may vary in other embodiments so that the desired thickness (e.g., between about 20 nm and about 50 nm) of the resulting channel (or channel layer) is achieved. Also the thickness of the sub-layers 906-912 may be varied to tune electrical, physical, and optical properties of the IGZO device. For example, FIG. 10 illustrates the sub-layers after undergoing an etching process to define an IGZO channel (or more particularly, a zinc-oxide-IGZO channel) 918 above the gate dielectric layer 904, over the gate electrode 904. As indicated in FIG. 10, additional sub-layers 914 (e.g., zinc oxide) and 916 (e.g., IGZO) were formed in the stack of sub-layers before the etching process such that the IGZO channel 918 includes six sub-layers 906-916.

Although not specifically shown, in some embodiments, the IGZO channel 918 (and the other components shown in FIG. 10) may undergo an annealing process. In some embodiments, the annealing process includes a relatively low temperature (e.g., less than about 500° C., preferably less than 450° C.) heating process in, for example, an ambient gaseous environment (e.g., nitrogen or oxygen, or air ambient)) to further enhance the crystalline structure of the IGZO. The heating process may occur for between about 5 minutes and about 120 minutes.

Referring now to FIG. 11, an etch-stop layer 920, a source region 922, a drain region 924, and a passivation layer 926 are then formed in a manner similar to that described above to substantially complete the formation of an IGZO device 928, such as an inverted, staggered bottom-gate IGZO TFT.

Because of the use of the alternating sub-layers in the IGZO channel 918, the enhanced crystalline structure of the IGZO may be even further enhanced (e.g., providing a C-Axis Aligned Crystal (CAAC)), thus further increasing the channel mobility. As with the embodiments utilizing the seed layer, the temperature required for the annealing process may be reduced, thus reducing overall processing temperatures, while still improving reliability and longevity.

Figure 12:
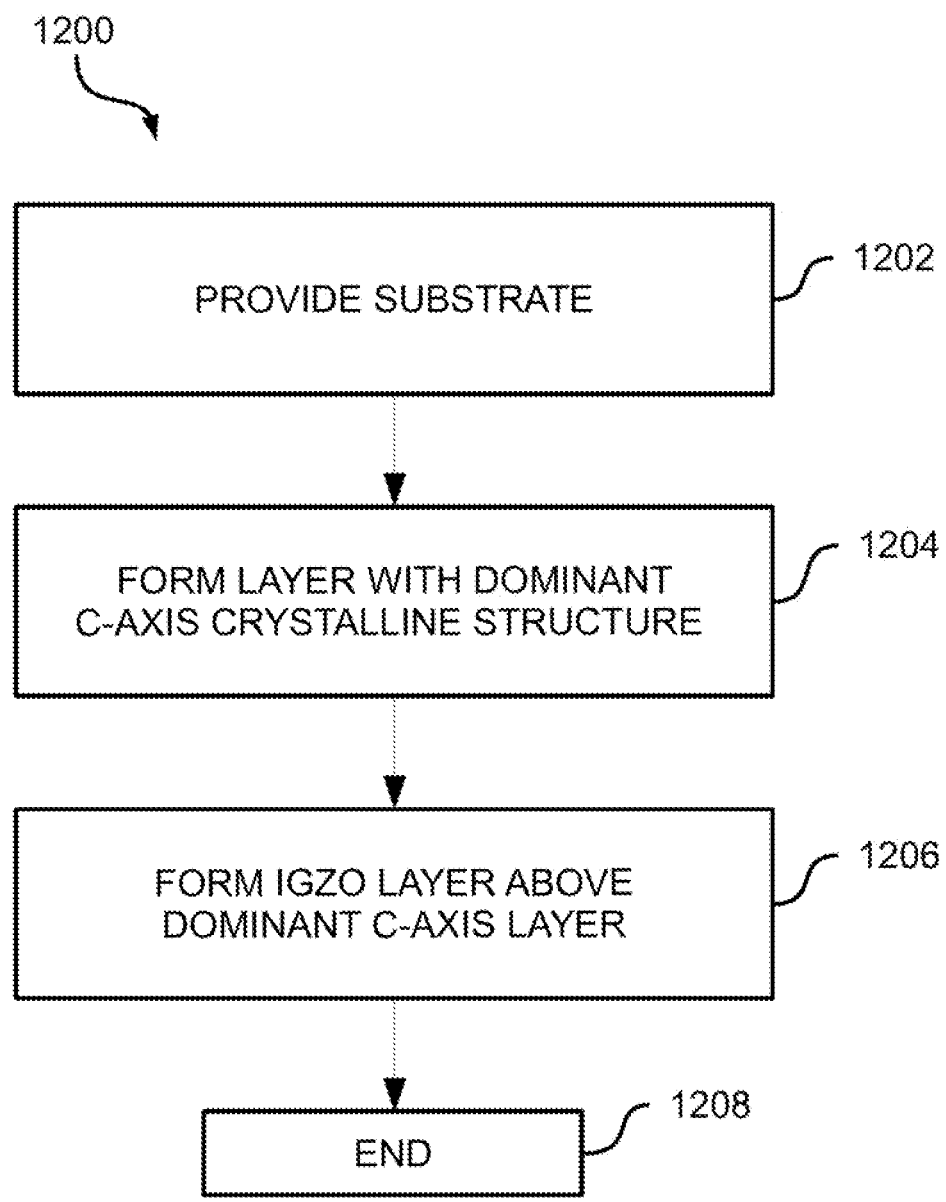
FIG. 12 is a block diagram illustrating a method for forming crystalline IGZO according to some embodiments.

FIG. 12 illustrates a method 1200 for forming crystalline IGZO (or for enhancing the crystalline structure IGZO, such as in an IGZO channel) according to some embodiments. At block 1202, the method 900 begins with a substrate being provided. As described above, the substrate may be made of glass.

At block 1204, a layer with a dominant c-axis crystalline structure is formed above the substrate. This layer may be considered a seed layer. In some embodiments, the layer is made of zinc oxide and has a thickness of between about 2 nm and about 10 nm, such as about 5 nm.

At block 1206, an IGZO layer is formed above the dominant c-axis layer. As described above, the deposition (or growth) of the IGZO layer above (e.g., adjacent to/on) the, for example, zinc oxide layer, enhances the crystalline structure of the IGZO layer, particularly along the c-axis (or the (009) plane).

In some embodiments, the processes performed at blocks 1204 and 1206 are repeated to form a stack of, for example, alternating zinc oxide and IGZO layers. In some embodiments, the zinc oxide and IGZO layer(s) are formed as components (e.g., an IGZO channel layer) in an IGZO device, such as an IGZO TFT. As such, although not shown, in some embodiments, the method 1200 includes the formation of additional components for an IGZO device, such as the gate electrode, gate dielectric layer, source/drain regions, etc. At block 1208, the method 1200 ends.

Thus, in some embodiments, a method is provided. A substrate is provided. A seed layer is formed above the substrate. The seed layer has a crystalline structure that is substantially dominant along the c-axis. A IGZO layer is formed above the seed layer.

In some embodiments, a method for forming an IGZO device is provided. A substrate is provided. A seed layer is formed above the substrate. The seed layer includes zinc oxide. An IGZO layer is formed above the seed layer.

In some embodiments, a method for forming an IGZO thin-film transistor is provided. A substrate is provided. A gate electrode is formed above the substrate. A seed layer is formed above the gate electrode. The seed layer includes zinc oxide. An IGZO layer is formed above the seed layer. A source region and a drain region are formed above the IGZO layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming an indium-gallium-zinc oxide (IGZO) device, the method comprising:
    providing a substrate;
    forming a seed layer above the substrate, wherein the seed layer has a crystalline structure that is substantially dominant along the c-axis;
    forming a channel layer above the seed layer, wherein the channel layer comprises a plurality of alternating first sub-layers and second sub-layers, each of the first sub-layers of the channel layer comprises IGZO, and each of the second sub-layers of channel layer has a crystalline structure that is substantially dominant along the c-axis; and
    forming a source region and a drain region above the channel layer.

2. The method of claim 1, wherein one of the first sub-layers of the channel layer is formed adjacent to the seed layer.

3. The method of claim 1, wherein the seed layer comprises zinc oxide.

4. The method of claim 3, wherein the seed layer has a thickness of between about 2 nanometers (nm) and about 10 nm.

5. The method of claim 4, wherein each of the second sub-layers of the channel layer comprises zinc oxide.

6. The method of claim 5, wherein each of the first sub-layers of the channel layer and each of the second sub-layers of the channel layer has a thickness between about 2 nm and about 10 nm.

7. The method of claim 1, further comprising forming a gate electrode above the substrate, wherein the seed layer is formed above the gate electrode.

8. The method of claim 7, further comprising forming a gate dielectric layer above the gate electrode, wherein the seed layer is formed above the gate dielectric layer.

9. A method for forming an indium-gallium-zinc oxide (IGZO) device, the method comprising:
provides a substrate;
forming a seed layer above the substrate, wherein the seed layer comprises zinc oxide;
forming a channel layer above the seed layer, wherein the channel layer consists of a plurality of alternating first sub-layers and second sub-layers, each of the first sub-layers of the channel layer comprises IGZO, each of the second sub-layers of channel layer comprises zinc oxide, and one of the first sub-layers of the channel layer is formed directly on the seed layer; and
forming a source region and a drain region above the channel layer.

10. The method of claim 9, wherein the seed layer has a thickness of between about 2 nanometers (nm) and about 10 nm.

11. The method of claim 10, wherein each of the first sub-layers of the channel layer and each of the second sub-layers of the channel layer has a thickness between about 2 nm and about 10 nm.

12. The method of claim 11, wherein the source region and the drain region are formed directly on one of the first sub-layers of the channel layer.

13. The method of claim 11, further comprising forming a gate electrode above the substrate, wherein the seed layer is formed above the gate electrode.

14. The method of claim 13, further comprising forming a gate dielectric layer above the gate electrode, wherein the seed layer is formed above the gate dielectric layer.

15. The method of claim 14, wherein each of the source region and the drain region comprises titanium, molybdenum, copper, copper-manganese alloy, or a combination thereof.

16. A method for forming an indium-gallium-zinc oxide (IGZO) thin-film transistor, the method comprising:
providing a substrate;
forming a gate electrode above the substrate;
forming a seed layer above the gate electrode, wherein the seed layer comprises zinc oxide;
forming a channel layer above the seed layer, wherein the channel layer comprises a plurality of alternating first sub-layers and second sub-layers, each of the first sub-layers of the channel layer comprises IGZO, and each of the second sub-layers of channel layer has a crystalline structure that is substantially dominant along the c-axis; and
forming a source region and a drain region above the channel layer.

17. The method of claim 16, wherein the seed layer has a thickness of between about 2 nanometers (nm) and about 10 nm.

18. The method of claim 17, wherein each of the first sub-layers of the channel layer and each of the second sub-layers of the channel layer has a thickness between about 2 nm and about 10 nm.

19. The method of claim 18, further comprising forming a gate dielectric layer above the gate electrode, wherein the seed layer is formed above the gate dielectric layer.

20. The method of claim 17, wherein each of the second sub-layers of the channel layer comprises zinc oxide.

* * * * *